United States Patent
Zhang et al.

(10) Patent No.: US 8,569,833 B2
(45) Date of Patent: Oct. 29, 2013

(54) LDMOS DEVICE STRUCTURE AND MANUFACTURING METHOD OF THE SAME

(75) Inventors: Shuai Zhang, Shanghai (CN); Haijun Wang, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/271,120

(22) Filed: Oct. 11, 2011

(65) Prior Publication Data
US 2012/0091524 A1    Apr. 19, 2012

(30) Foreign Application Priority Data
Oct. 13, 2010  (CN) .......................... 2010 1 0505593

(51) Int. Cl.
*H01L 29/76* (2006.01)
*H01L 29/94* (2006.01)

(52) U.S. Cl.
USPC ........... 257/335; 257/336; 257/341; 257/344; 257/347; 438/423

(58) Field of Classification Search
USPC .......... 257/335–336, 341, 344, 347, E29.256, 257/E21.545; 438/423
See application file for complete search history.

(56) References Cited

U.S. PATENT DOCUMENTS

| | | | | |
|---|---|---|---|---|
| 5,874,768 A | * | 2/1999 | Yamaguchi et al. | 257/493 |
| 2010/0019311 A1 | * | 1/2010 | Sato et al. | 257/326 |
| 2010/0203703 A1 | * | 8/2010 | Tilke et al. | 438/424 |

* cited by examiner

*Primary Examiner* — Theresa T Doan
(74) *Attorney, Agent, or Firm* — Blakely Sokoloff Taylor & Zafman

(57) ABSTRACT

The present invention discloses an LDMOS device structure, including a MOS transistor cell, wherein an isolation region is formed on each outer side of both a source region and a drain region of the MOS transistor cell; each isolation region includes a plurality of isolation trenches and isolates the MOS transistor cell from its surroundings; the height of the isolation region is smaller than that of a gate of the MOS transistor cell. The present invention also discloses a manufacturing method of the LDMOS device structure, including forming isolation trenches by lithography and etching processes, then forming isolation regions of $SiO_2$ by depleting silicon between isolation trenches through high-temperature drive-in. The present invention can reduce parasitic capacitance, surface unevenness and difficulty of subsequent process and realize the production of small-size gate devices by forming a thicker field oxide layer and a gap structure of isolation trenches.

4 Claims, 4 Drawing Sheets

LDMOS DEVICE STRUCTURE AND MANUFACTURING METHOD OF THE SAME

CROSS-REFERENCES TO RELATED APPLICATIONS

This application claims the priority of Chinese patent application number 201010505593.9, filed on Oct. 13, 2010, the entire contents of which are incorporated herein by reference.

TECHNICAL FIELD

The present invention relates to a semiconductor device structure, especially to an LDMOS device structure. The present invention also relates to a manufacturing method of a semiconductor device structure, especially to a manufacturing method of LDMOS device structure.

BACKGROUND OF THE INVENTION

LDMOS is one of the most commonly used devices in the RF process. Based on LDMOS, an RFLDMOS with low-cost, high-performance, and high-integration can be formed and applied in high-frequency communication field and other application fields requiring high speed. FIG. 1 shows the structure of a common RFLDMOS. How to reduce the parasitic capacitance in an insulating region to increase the response frequency of the device becomes a major technical difficulty. A common practice to reduce the parasitic capacitance in the insulating region is to greatly increase the thickness of a field oxide film. For the RFLDMOS typically used in 2.4 GHz or higher, the thickness of its oxide film is more than 1 μm. As the required thickness of the field oxidation is too large, the field oxidation can't be formed by STI process and is usually formed by LOCOS process, which will bring a large unevenness on the substrate after the field oxidation is completed and greatly limit the subsequent process, therefore, the production of small-size devices can't be realized. For example, for a 0.5 μm RFLDMOS used in 2.4 Ghz, the thickness of the field oxidation is usually more than 1 μm, typically 2-3 μm. Meanwhile the field oxidation is 0.5 μm higher than the substrate surface, and for a 0.5 μm gate, its lithography process window is 0.8~1 μm. Therefore the substrate has a large unevenness, making the critical dimension of the device difficult to control and leading to a low yield product and a high production cost of the RFLDMOS. Moreover, based on this structure, the production of a gate below 0.5 μm is almost impossible. Furthermore, as the field oxidation is usually formed through thermal oxidation, air gaps cannot be formed in isolation regions to further reduce the capacitance, therefore the processing property is also limited.

SUMMARY OF THE INVENTION

An objective of the present invention is to provide an LDMOS device structure and its manufacturing method which can reduce parasitic capacitance, surface unevenness and difficulty of subsequent process and realize the production of small-size gate devices.

To achieve the above objective, the present invention provides an LDMOS device structure, comprising a MOS transistor cell, wherein an isolation region is formed on each outer side of both a source region and a drain region of the MOS transistor cell; each isolation region formed of silicon dioxide comprises a plurality of isolation trenches and isolates the MOS transistor cell from its surroundings; a height of the isolation region is smaller than or equal to that of the gate of the MOS transistor cell.

To achieve the above objective, the present invention also provides a manufacturing method of LDMOS device structure, comprising the following steps:

step 1: forming an isolation layer on a substrate by epitaxy, and then forming a connecting layer connecting to the substrate in the isolation layer by implantation;

step 2: growing $SiO_2$ as a hard mask on the isolation layer and then forming a plurality of isolation trenches by dry etching the isolation layer and hard mask;

step 3: forming isolation regions of $SiO_2$, by depleting silicon between the isolation trenches through high temperature drive-in;

step 4: removing the $SiO_2$ outside the isolation regions by chemical liquid, and then forming a source, a drain and a gate.

By forming thicker $SiO_2$ isolation regions and a gap structure of isolation trenches, the present invention can reduce parasitic capacitance, surface unevenness and difficulty of subsequent process and realize the production of small-size gate devices.

BRIEF DESCRIPTION OF THE DRAWINGS

The present invention will be further described and specified in combination with the drawings and embodiments below.

Figure 1:
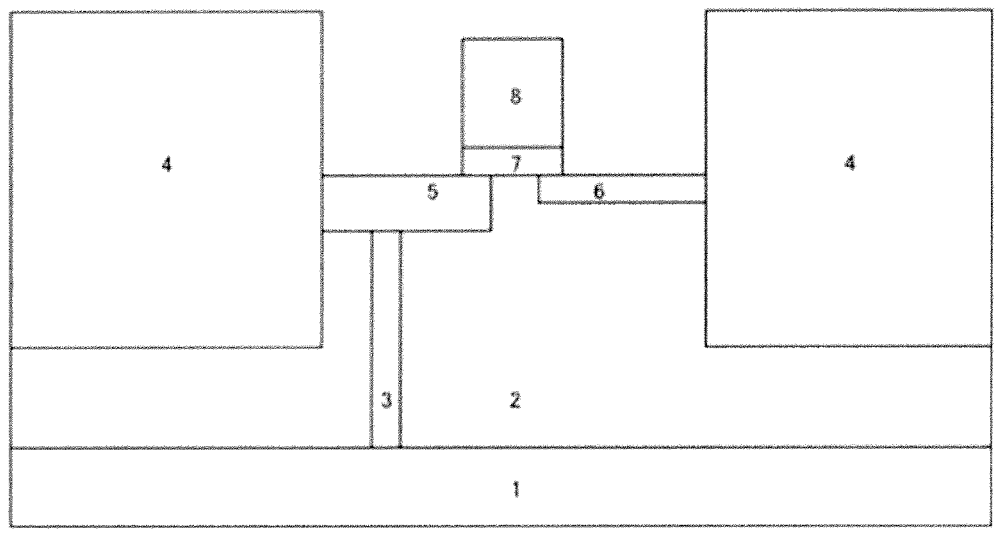
FIG. 1 is a schematic diagram showing the structure of an existing LDMOS device.
Figure 2:
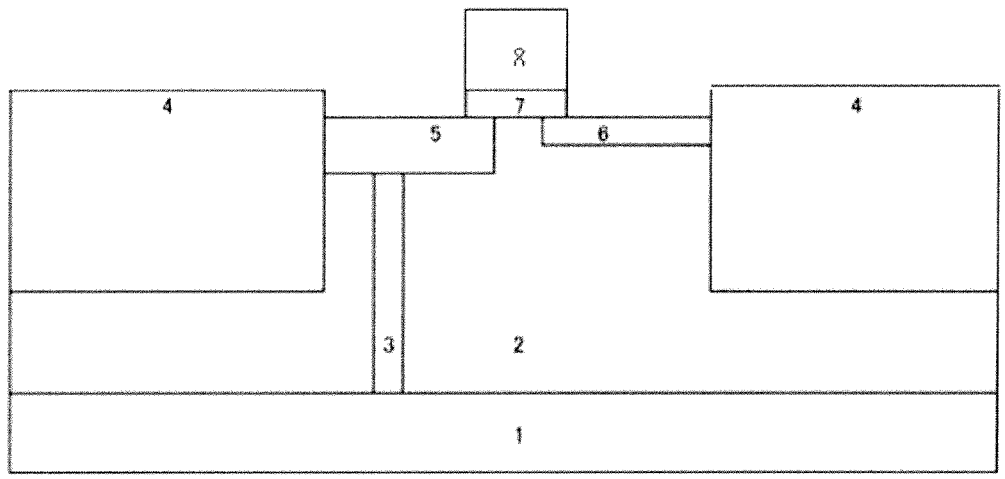
FIG. 2 is a schematic diagram showing the structure of an LDMOS device according to the present invention.

wherein, 1 refers to a substrate; 2 refers to an epitaxial layer; 3 refers to a connecting layer; 4 refers to isolation regions; 5 refers to a source region; 6 refers to a drain region; 7 refers to gate oxide; 8 refers to a gate; 9 refers to isolation trenches; 10 refers to silicon dioxide; 11 refers to a hard mask; 12 refers to photoresist.

DETAILED DESCRIPTION OF THE INVENTION

The present invention discloses an LDMOS device structure. As shown in FIG. 2 to FIG. 8, the structure includes a MOS transistor cell, wherein an isolation region 4 is formed on each outer side of both a source region 5 and a drain region 6 of the MOS transistor cell; each isolation region 4 formed of silicon dioxide comprises a plurality of isolation trenches 9 and isolates the MOS transistor cell from its surroundings; the height of the isolation region 4 is smaller than or equal to that of a gate 8 of the MOS transistor cell.

Air gaps exist in the isolation trenches 9.

The isolation trenches 9 are deep trenches.

Figure 3:
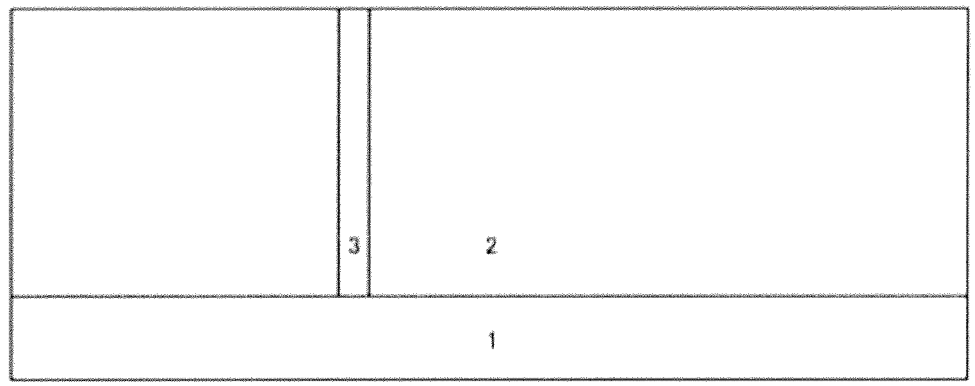
FIG. 3 to FIG. 8 are schematic diagrams showing the steps of the manufacturing method of LDMOS device structure according to the present invention.
Figure 4:
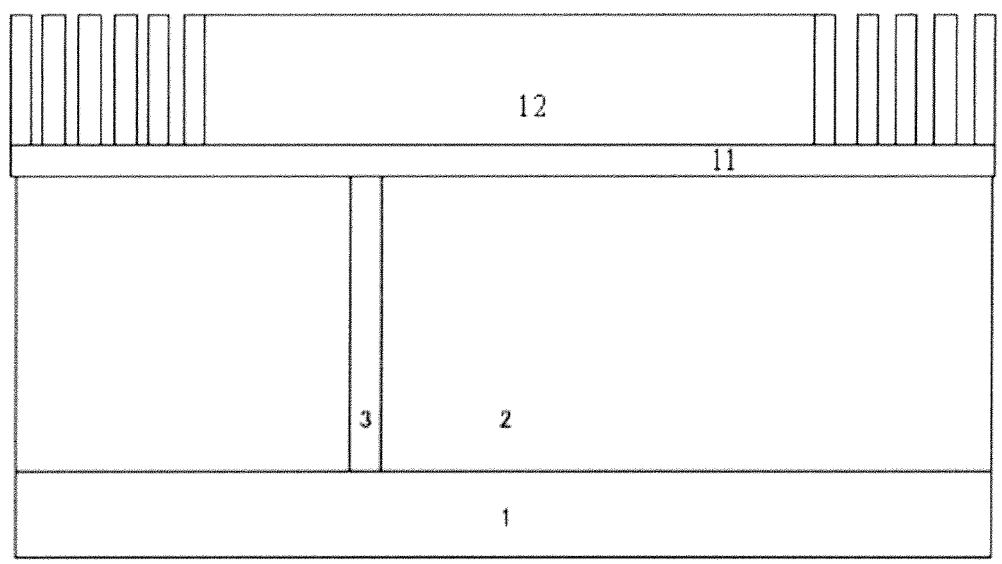
Figure 5:
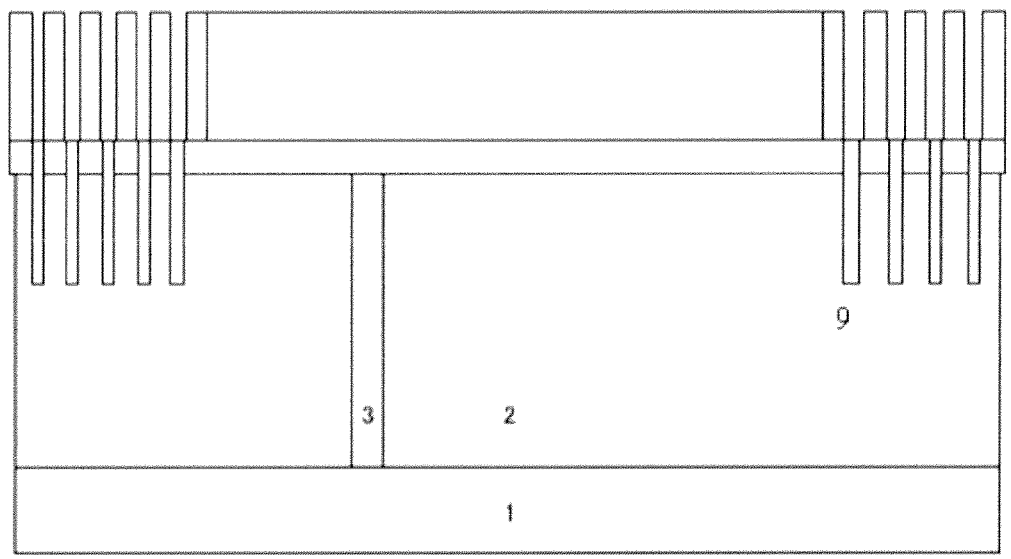
Figure 6:
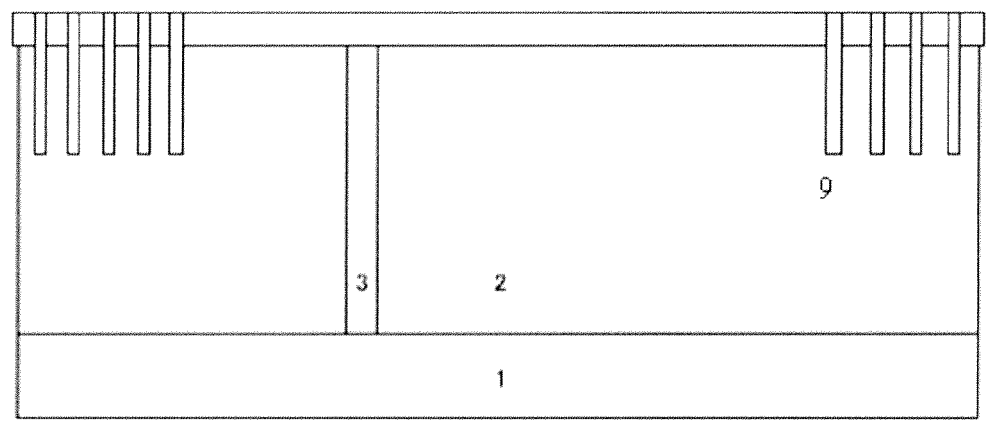
Figure 7:
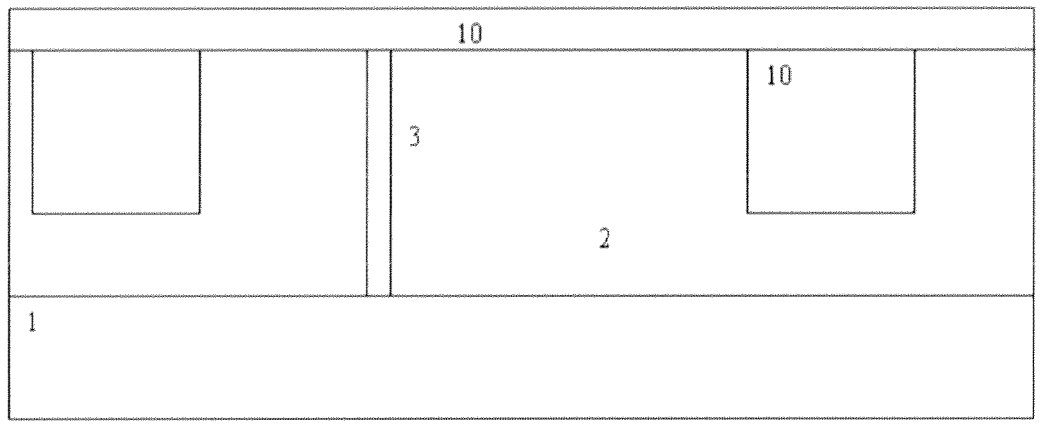
Figure 8:
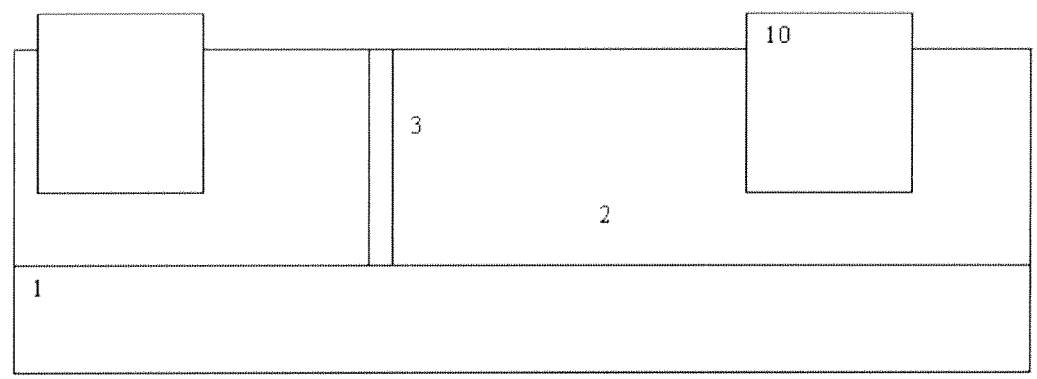

The present invention also provides a manufacturing method of the LDMOS device structure as shown in FIG. 3 to FIG. 8, comprising the following steps:

step 1: as shown in FIG. 3, forming an isolation layer 2 on a substrate 1 by epitaxy for isolating the device and the substrate 1, and then forming a connecting layer 3 in the isolation layer 2 by implantation for connecting the device and the substrate 1;

step 2: as shown in FIG. 4 and FIG. 5, growing $SiO_2$ as a hard mask 11 and forming a pattern of isolation regions 4 by lithography in a photoresist 12 on the hard mask, and then forming a plurality of isolation trenches 9 by dry etching the isolation layer 2 and hard mask 11;

step 3: as shown in FIG. 6, forming isolation regions of SiO$_2$ by depleting silicon between the deep trenches 9 through high temperature drive-in;

step 4: as shown in FIG. 7 and FIG. 8, removing SiO$_2$ 10 outside the isolation regions by chemical liquid, and then carrying out subsequent processing to form a source, a drain and a gate.

In existing RFLDMOS process, field oxidation with a large thickness and LOCOS process are generally adopted to reduce the parasitic capacitance of an isolation structure. However, as the LOCOS process uses thermal oxidation which needs a long-time, high-temperature drive-in and requires a high cost, the LOCOS process cannot be used for large-scale mass production of devices with over-thick oxide layer. Moreover, as the LOCOS process also has problems of lateral expansion and unevenness on the substrate, the size of devices cannot be controlled and the production of small-size devices cannot be realized in subsequent process.

To solve the above-mentioned problems, the present invention depletes the silicon between the trenches by carrying out high temperature oxidation to a plurality of deep and small-size isolation trenches to form isolation regions with large areas to isolate the RFLDMOS, by which, an isolation structure with a thicker oxide layer can be produced and the isolation with low parasitic capacitances is realized; the height difference between the isolation regions and the active region is greatly reduced to decrease the difficulty of subsequent process, therefore the production of small-size gate devices is realized.

What is claimed is:

1. An LDMOS device structure, comprising a MOS transistor cell, wherein an isolation region is formed on each outer side of both a source region and a drain region of the MOS transistor cell;

each isolation region formed of silicon dioxide comprises a plurality of isolation trenches and isolates the MOS transistor cell from its surroundings;

a height of the isolation region is shorter than or equal to that of a gate of the MOS transistor cell, wherein air gaps exist in the isolation trenches.

2. The LDMOS device structure according to claim 1, wherein the isolation trenches are deep trenches.

3. The LDMOS device defined by claim 1 further comprising:

(i) an isolation layer formed on a substrate, (ii) a connecting layer formed on and connected to said substrate and said source in the isolation layer.

4. The LDMOS device defined by claim 3, wherein the isolation trenches are deep trenches.

* * * * *